United States Patent
Tanigawa et al.

(10) Patent No.: US 9,791,522 B2
(45) Date of Patent: Oct. 17, 2017

(54) MAGNETIC FIELD DETECTION SENSOR

(71) Applicant: YAZAKI CORPORATION, Tokyo (JP)

(72) Inventors: Junya Tanigawa, Shizuoka (JP); Makoto Ishii, Shizuoka (JP); Hiroki Sugiyama, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/144,019

(22) Filed: May 2, 2016

(65) Prior Publication Data
US 2016/0245879 A1  Aug. 25, 2016

Related U.S. Application Data

(63) Continuation of application No. PCT/JP2014/078820, filed on Oct. 29, 2014.

(30) Foreign Application Priority Data

Nov. 8, 2013  (JP) ................................ 2013-231743

(51) Int. Cl.
*G01R 33/04* (2006.01)
*G01R 33/06* (2006.01)
(Continued)

(52) U.S. Cl.
CPC ....... *G01R 33/063* (2013.01); *G01R 33/0017* (2013.01); *G01R 33/0023* (2013.01); *G01R 33/0041* (2013.01); *G01R 33/028* (2013.01)

(58) Field of Classification Search
CPC ........................... G01R 33/0023; G01R 33/063
(Continued)

(56) References Cited

U.S. PATENT DOCUMENTS 6,028,427 A  2/2000  Kawase
6,456,068 B1  9/2002  Kawase
(Continued)

FOREIGN PATENT DOCUMENTS

JP  9-127218 A  5/1997
JP  2000-180521 A  6/2000
(Continued)

OTHER PUBLICATIONS

International Search Report for PCT/JP2014/078820 dated Feb. 10, 2015 [PCT/ISA/210].

*Primary Examiner* — Reena Aurora
(74) *Attorney, Agent, or Firm* — Sughrue Mion, PLLC

(57) ABSTRACT

A magnetic field detection sensor includes a magneto-impedance element configured to make use of the magneto-impedance effect, and a negative-feedback bias coil configured to apply a bias magnetic field to the magneto-impedance element. The magnetic field detection sensor is configured to detect an external magnetic field based on an output obtained by applying an alternating-current to the magneto-impedance element. The magneto-impedance element includes a non-magnetic substrate, and a magnetic thin-film that is provided on a surface of the non-magnetic substrate. The magnetic field detecting direction matches the longitudinal direction of the magneto-impedance element, and the magnetic thin-film is configured to have a magnetic anisotropy such that a direction of an axis of easy magnetization thereof matches the magnetic field detecting direction.

2 Claims, 6 Drawing Sheets

(51) Int. Cl.
*G01R 33/00* (2006.01)
*G01R 33/028* (2006.01)

(58) Field of Classification Search
USPC .......................................................... 324/249
See application file for complete search history.

(56) References Cited

U.S. PATENT DOCUMENTS

| 9,261,571 B2* | 2/2016 | Schaffer | G01R 33/04 |
| 2004/0080316 A1* | 4/2004 | Friend | G01C 17/30 |
| | | | 324/244 |

FOREIGN PATENT DOCUMENTS

| JP | 2001-116814 A | 4/2001 |
| JP | 2006-58236 A | 3/2006 |

* cited by examiner

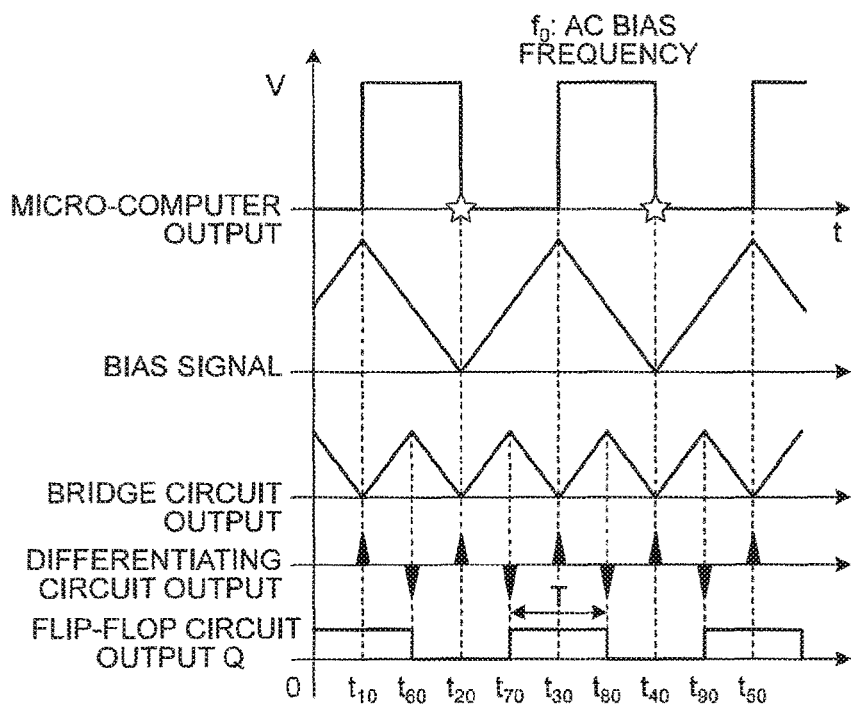
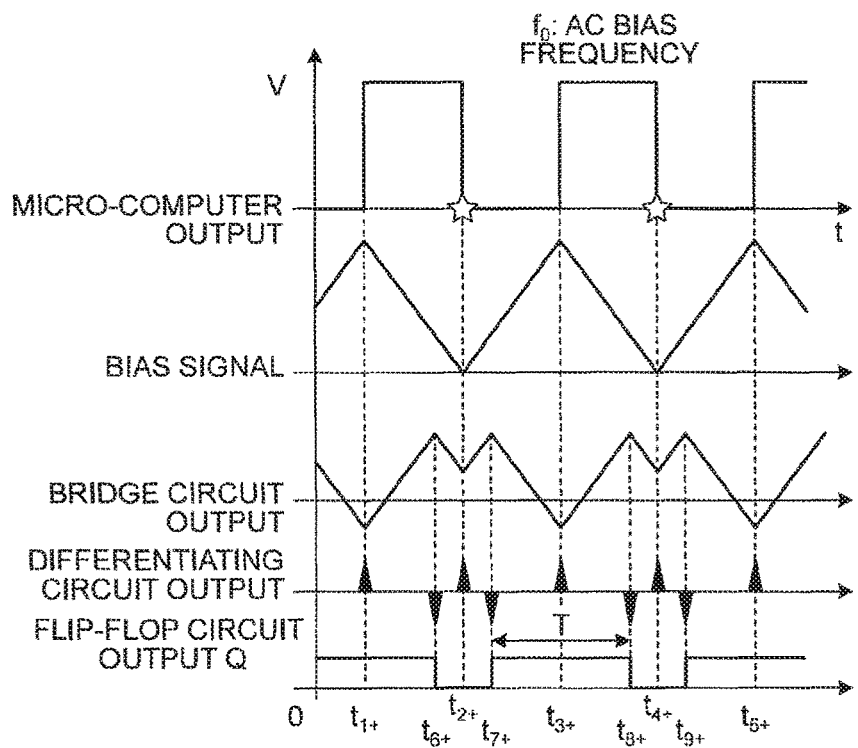

MAGNETIC FIELD DETECTION SENSOR

CROSS-REFERENCE TO RELATED APPLICATION

This application is a continuation application of International Application PCT/JP2014/078820, filed on Oct. 29, 2014, and designating the U.S., the entire contents of which are incorporated herein by reference.

BACKGROUND OF THE INVENTION

1. Field of the Invention

The present invention relates to a magnetic field detection sensor.

2. Description of the Related Art

Having been conventionally disclosed is a magnetic field detection sensor including a magneto-impedance (MI) element that makes use of the magneto-impedance effect of an amorphous wire. Downsizing is easier with an MI element, compared with a flux gate sensor, and sensors using an MI element exhibit detection sensitivity equivalent to that of flux gate sensors.

An example of such magnetic field detection sensors using the MI element will now be explained. An oscillator circuit applies an alternating-current (AC) bias current to a coil wound around an MI element. An AC bias magnetic field is generated thereby in the MI element, and an amplitude-modulated (AM) waveform whose peaks have a height difference alternately is acquired as an output. A detector circuit is configured to detect the output, and removes a direct-current (DC) component, and the resultant waveform is input to a comparator. The magnetic field detection sensor then acquires an output signal with a digital waveform having been pulse-modulated based on the height difference. Such a magnetic field detection sensor acquires the strength of the external magnetic field, not based on the absolute value of the amplitude of the output from the oscillator circuit, but based on the amount of change in the amplitude. Therefore, such a magnetic field detection sensor is less affected by a variation in the source voltage, the temperature characteristics of the element, and the like, so that not only precise adjustment of the oscillator circuit is rendered unnecessary, but also a magnetic field detection sensor robust against noise can be provided (see Japanese Patent Application Laid-open No. 9-127218).

Also disclosed is a magnetic field detection sensor including an oscillator circuit that applies a high-frequency sine wave current to both ends of a magnetic core, a buffer circuit that is disposed between the oscillator circuit and the magnetic core of a thin-film magneto-impedance element, and adjusts mismatch between an output impedance of the oscillator circuit and an input impedance of the thin-film magneto-impedance element, a detector circuit for detecting an amount of magnetic change in the external magnetic field based on the amount of change in the high-frequency current which changes according to the external magnetic field applied to the magneto-impedance element, and a hysteresis cancelling circuit that cancels the hysteresis in the magneto-impedance element. Because such a magnetic field detection sensor is provided with a buffer circuit, for example, the output resultant of the high-frequency current applied by the oscillator circuit can be supplied without any loss (see Japanese Patent Application Laid-open No. 2000-180521). In the magnetism detection sensor, because the inclination representing the amount of change, which is dependent on the external magnetic field applied to the magneto-impedance element, becomes steepest at 400 A/m, as illustrated in FIG. 5 in Japanese Patent Application Laid-open No. 2000-180521, a constant current that moves the operating point to the point where the amount of change becomes steepest is applied to the bias coil.

The magnetic field detection sensors disclosed in Japanese Patent Application Laid-open No. 9-127218 and Japanese Patent Application Laid-open No. 2000-180521 are, however, incapable of making highly sensitive measurement unless applied is an AC bias at a level at which the inclination of the impedance change becomes steep (up to ±400 A/m in FIG. 5 disclosed in Japanese Patent Application Laid-open No. 2000-180521), because the impedance that is dependent on the magnetic field of the MI element changes in an M-shape. Therefore, the current consumption is increased. Similarly, an approach for applying a DC bias at a level at which the inclination of the impedance change becomes steep requires an increased amount of current consumption.

Furthermore, because a hysteresis is increased in the M-shaped characteristics, the detection precision is deteriorated by the amount of the hysteresis. Moreover, because the magnetic field can only be measured highly sensitively within the range where a steep inclination is ensured, only a limited detection range has been available.

SUMMARY OF THE INVENTION

The present invention is made to overcome the problem described above, and an object of the present invention is to provide a magnetic field detection sensor capable of reducing the current consumption, improving the detection precision, and increasing the detection range.

To achieve the above-described objective, a magnetic field detection sensor according to one aspect of the present invention includes a magneto-impedance element configured to make use of a magneto-impedance effect; a bias coil configured to apply a bias magnetic field to the magneto-impedance element; an oscillator circuit configured to apply an alternating-current to the magneto-impedance element; a differentiating circuit configured to differentiate an output of the magneto-impedance element; a flip-flop circuit configured to output a high level signal and a low level signal based on a trigger waveform output from the differentiating circuit; and a computing unit configured to detect an external magnetic field based on a high and low timing of the high level and low level signal output from the flip-flop circuit, wherein the magnetic field detection sensor is configured to detect the external magnetic field based on an output obtained by applying the alternating-current to the magneto-impedance element, the magneto-impedance element includes a non-magnetic substrate and a magnetic film provided on a surface of the non-magnetic substrate, a magnetic field detecting direction matches a longitudinal direction of the magneto-impedance element, and the magnetic film is configured to have a magnetic anisotropy such that an axis of easy magnetization thereof matches the magnetic field detecting direction, and the computing unit is configured to transmit a reset signal to the flip flop circuit at timing of a fall of an alternating-current bias frequency, and detect the external magnetic field based on a duration of a first high level signal subsequent to the reset signal.

According to another aspect of the present invention, in the magnetic field detection sensor, it is preferable that the bias coil is composed of a single negative-feedback bias coil configured to apply the bias magnetic field and a negative-feedback magnetic field to the magneto-impedance element.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a timing chart illustrating various signals when the external magnetic field is 0 [H/m];

FIG. 6 is a timing chart illustrating various signals when the external magnetic field is positive;

DETAILED DESCRIPTION OF THE PREFERRED EMBODIMENTS

An exemplary embodiment of the present invention will now be explained with reference to some drawings. The scope of the present invention is, however, not limited to the embodiment.

Figure 1:
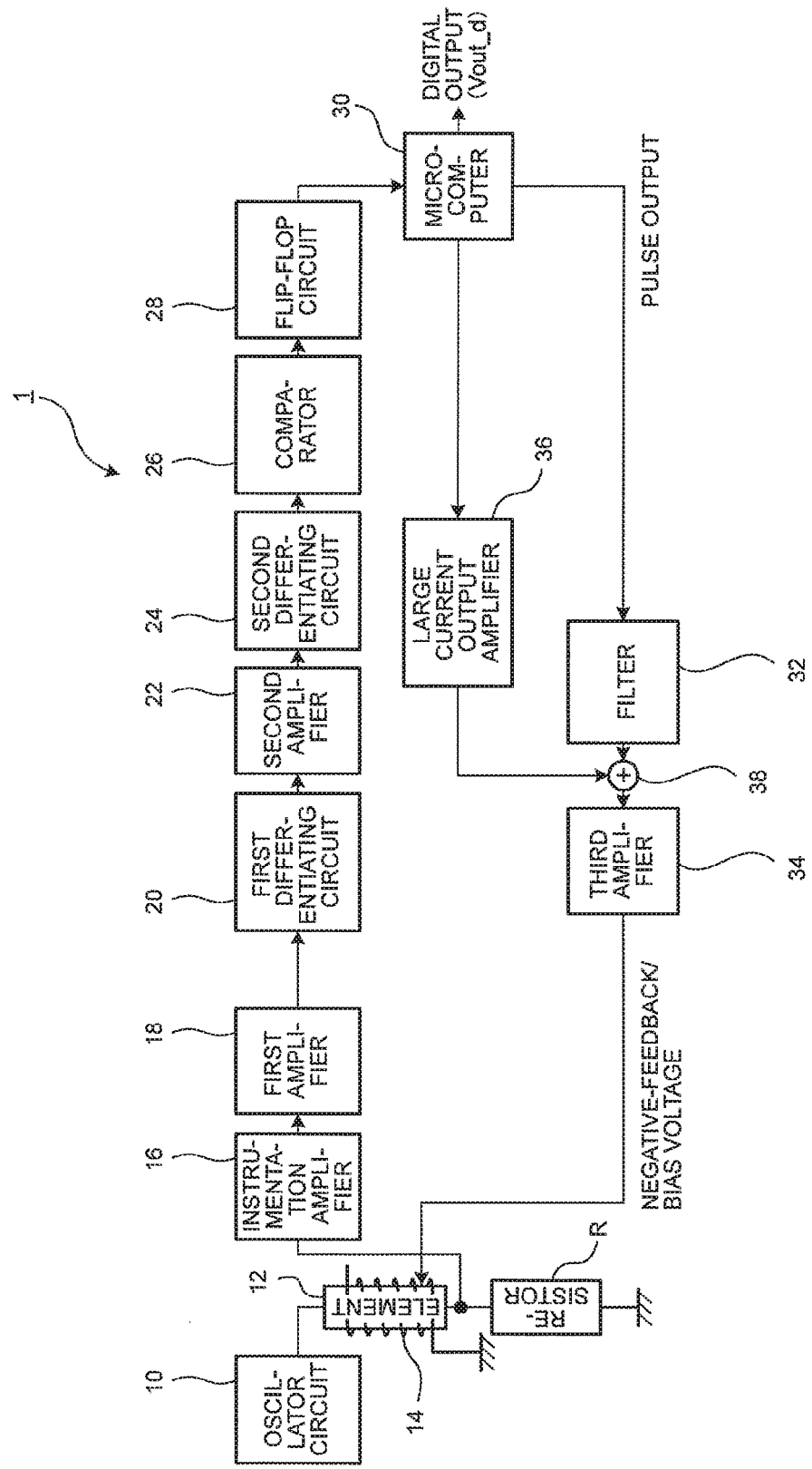
FIG. 1 is a circuit diagram schematically illustrating a magnetic field detection sensor according to an embodiment.

FIG. 1 is a circuit diagram schematically illustrating a magnetic field detection sensor according to an embodiment. This magnetic field detection sensor 1 illustrated in FIG. 1, which is provided as a magnetism detector, is configured to detect an external magnetic field (the direction, the azimuth, and the strength of the magnetism) based on an output of a magneto-impedance element 12 to which an AC current is applied, and is used as an element in a current sensor, an azimuth sensor, a torque sensor, or a rotation angle sensor, for example. Such a magnetic field detection sensor 1 serving as a magnetism detector includes an oscillator circuit 10, the magneto-impedance element 12, a resistor R, and a negative-feedback bias coil (bias coil) 14.

The oscillator circuit 10 is a source of an AC voltage for driving the magneto-impedance element 12, that includes a crystal oscillator, for example, and is configured to output an alternating current signal (AC voltage). The AC voltage output from the oscillator circuit 10 is applied to the magneto-impedance element 12. The magneto-impedance element 12 includes a zero magnetostriction amorphous magnetic body or a magnetic thin-film, for example, and is configured to exhibit a magneto-impedance effect. The magneto-impedance effect is a phenomenon in which the impedance changes, when a high-frequency current is supplied, for example, due to a change in the skin depth.

This occurs because the magnetic permeability changes greatly in the circumferential direction by receiving the application of external magnetic field. One end of the magneto-impedance element 12 is connected to the oscillator circuit 10, and the other end is connected to one end of the resistor R. The other end of the resistor R is grounded.

The negative-feedback bias coil 14 is a coil that is wound around the magneto-impedance element 12. The negative-feedback bias coil 14, however, does not need to be wound around the magneto-impedance element 12 serving as a core, as long as the negative-feedback bias coil 14 is capable of applying a bias magnetic field to the magneto-impedance element 12. Furthermore, in the example described above, the magneto-impedance element 12 and the resistor R are configured as a half bridge, but the circuitry may have a full-bridge configuration including three resistors, without limitation to the half-bridge configuration.

Figure 2A:
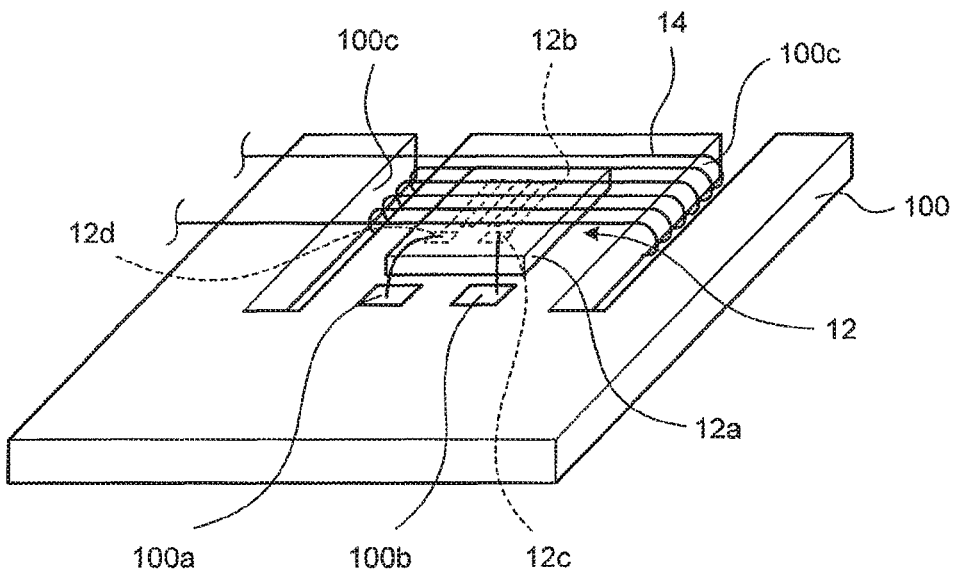
FIG. 2A is a perspective view illustrating a first example of a magneto-impedance element and structures around the magneto-impedance element according to the embodiment in detail.
Figure 2B:
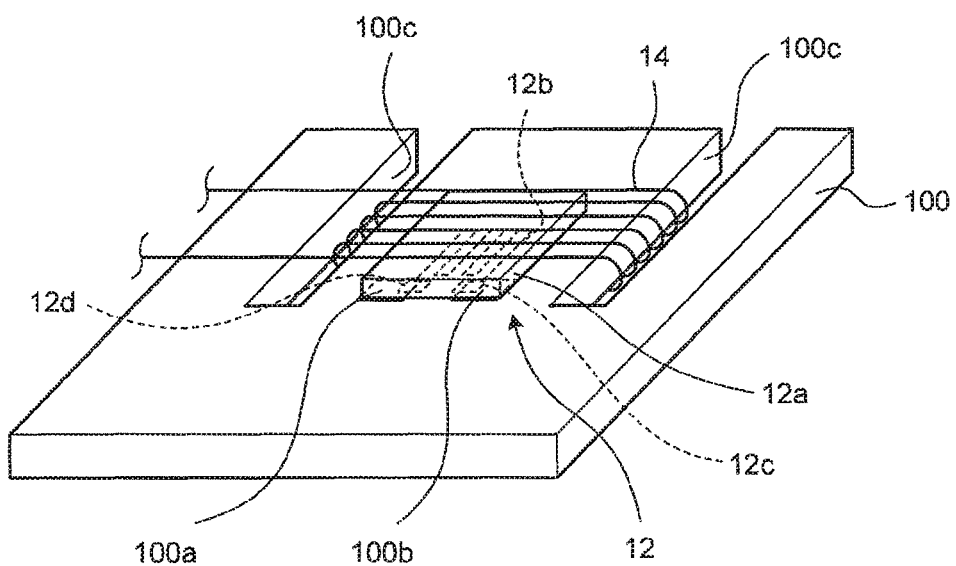
FIG. 2B is a perspective view illustrating a second example of the magneto-impedance element and the structures around the magneto-impedance element according to the embodiment in detail.

FIGS. 2A and 2B are perspective views illustrating the magneto-impedance element 12 according to the embodiment and the structures around the magneto-impedance element 12 in detail. FIG. 2A illustrates a first example, and FIG. 2B illustrates a second example. As illustrated in FIG. 2A, the magneto-impedance element 12 includes a non-magnetic substrate 12a, a magnetic thin-film (magnetic film) 12b, and electrodes 12c and 12d.

The non-magnetic substrate 12a is a substrate made of a non-magnetic body, and is placed on a printed board 100. This non-magnetic substrate 12a is made of calcium titanate, oxide glass, titania, or alumina, for example, and has a substantially cuboid shape, in the embodiment.

The magnetic thin-film 12b is a magnetic metal film with high magnetic permeability, arranged in a surface of the non-magnetic substrate 12a opposite to a surface on which the printed board 100 is disposed, and has a meandering shape (serpentine shape) in a plan view, as illustrated in FIG. 2A. More specifically, the magnetic thin-film 12b has a rectangular-wave shape, rising and falling thereof extending in the longitudinal direction of the non-magnetic substrate 12a having a substantially cuboid shape.

The magnetic thin-film 12b is configured to have a magnetic anisotropy such that an axis-of-easy-magnetization direction is aligned with the longitudinal direction of the magnetic thin-film 12b on the film surface, and the overall axis-of-easy-magnetization direction of the magnetic thin-film 12b is aligned with the longitudinal direction of the non-magnetic substrate 12a. The axis-of-easy-magnetization direction herein means the orientation of a crystal in which the magnetic thin-film (magnetic body) 12b having a anisotropy is easily magnetized.

The electrodes 12c and 12d are provided to the surface of the non-magnetic substrate 12a at respective ends of the magnetic thin-film 12b. The electrodes 12c and 12d are connected to respective electrodes 100a and 100b provided on the printed board 100, via bonding wires. The electrodes 100a and 100b provided on the printed board 100 are connected to the oscillator circuit 10 and the resistor R, respectively, illustrated in FIG. 1.

The printed board 100 also has a notch 100c on each side of the magneto-impedance element 12 in the width direction, in a manner spaced with the magneto-impedance element 12, as illustrated in FIG. 2A. The notches 100c extend from one end of the printed board 100 toward proximity of the center of the printed board 100.

The negative-feedback bias coil 14 is wound around the magneto-impedance element 12, via the notches 100c of the printed board 100. The direction of the coil axis of the negative-feedback bias coil 14 is therefore matched with the longitudinal direction of the non-magnetic substrate 12a, and, therefore, the magnetic field detecting direction will matches the longitudinal direction of the magneto-impedance element 12. Because the axis-of-easy-magnetization direction is matched with the longitudinal direction of the non-magnetic substrate 12a, as mentioned earlier, the magnetic thin-film 12b can be said to be provided with a magnetic anisotropy such that an axis of easy magnetization matches the magnetic field detecting direction.

The magnetic thin-film 12b may be provided on the rear side of the non-magnetic substrate 12a, that is, on the surface on which the printed board 100 is disposed, as illustrated in FIG. 2B. In such a configuration, the electrodes 12c and 12d are provided to respective ends of the magnetic thin-film 12b on the rear surface of the non-magnetic substrate 12a. The electrodes 100a and 100b, too, are provided on the side of the printed board 100 facing the rear side of the non-magnetic substrate 12a.

Referring back to FIG. 1, the magnetic field detection sensor 1 also includes an instrumentation amplifier 16, a first amplifier 18, a first differentiating circuit 20, a second amplifier 22, a second differentiating circuit 24, a comparator 26, a flip-flop circuit 28, and a micro-computer (computing unit) 30, in addition to the units described above, and these units are sequentially connected in the order listed herein.

The instrumentation amplifier 16 receives, as an input, an output from the half-bridge circuit having the magneto-impedance element 12 and the resistor R. The first amplifier 18 is connected subsequent to the instrumentation amplifier 16. The output voltage from the half-bridge circuit is amplified by the instrumentation amplifier 16 and the first amplifier 18, and then input to the first differentiating circuit 20.

The first differentiating circuit 20 is configured to detect a point of change in the voltage amplified by the instrumentation amplifier 16 and the first amplifier 18. The first differentiating circuit 20 outputs the point of change in the voltage output from the half-bridge circuit, as a trigger waveform. The second amplifier 22 then amplifies the output from the first differentiating circuit 20. The second differentiating circuit 24 is configured to detect a point of change in the voltage amplified by the second amplifier 22. The second amplifier 22 and the second differentiating circuit 24 enable the trigger waveform to be output in a more prominent form. Although the magnetic field detection sensor 1 according to the embodiment is provided with the first differentiating circuit 20 for differentiating the output of the magneto-impedance element 12, the second amplifier 22, and the second differentiating circuit 24 for differentiating the output of the magneto-impedance element 12, the magnetic field detection sensor may be, alternatively, provided with one differentiating circuit for differentiating the output of the magneto-impedance element 12.

The trigger waveform output from the second differentiating circuit 24 is input to the comparator 26. The flip-flop circuit 28 outputs a HIGH level signal and a LOW level signal based on the trigger waveform. The micro-computer 30 then detects the timing of HIGH and LOW. The timing of HIGH and LOW reflects the external magnetic field, as will be explained later in describing an operation. The micro-computer 30 therefore detects the external magnetic field based on the timing of HIGH and LOW. As the flip-flop circuit 28, a J-K flip-flop circuit is used.

The micro-computer 30 also generates a pulse voltage for applying a bias magnetic field to the negative-feedback bias coil 14. The magnetic field detection sensor 1 includes a filter 32 and a third amplifier 34. The filter 32 converts the pulse output from the micro-computer 30 into a triangle wave, and the triangle wave output from the filter 32 is applied, as an AC bias, to the negative-feedback bias coil 14 via the third amplifier 34. In this manner, the bias magnetic field is applied to the magneto-impedance element 12.

The micro-computer 30 also outputs a signal (negative-feedback signal) for applying a magnetic field in a direction opposite to the detected external magnetic field to the magneto-impedance element 12. The magnetic field detection sensor 1 includes a large current output amplifier 36 and an adder 38. The large current output amplifier 36 amplifies the negative-feedback signal output from the micro-computer 30. The adder 38 is disposed between the filter 32 and the third amplifier 34, and adds the triangle wave signal output from the filter 32 to the negative-feedback signal amplified by the large current output amplifier 36. In this manner, the bias voltage and the negative-feedback voltage are applied to the negative-feedback bias coil 14 via the third amplifier 34.

As described above, because the magnetic field detection sensor 1 according to the embodiment implements a bias and a negative-feedback in one negative-feedback bias coil 14, the magnetic field detection sensor 1 can suppress an increase in size and costs, compared with a configuration in which a negative-feedback coil and a bias coil are provided separately.

An action, an operation, and the like of the magnetic field detection sensor 1 according to the embodiment will now be explained. By matching the magnetic field detecting direction to the axis of easy magnetization of the magnetic thin-film 12b, pyramid-shaped magneto-impedance characteristics can be achieved.

Figure 3:
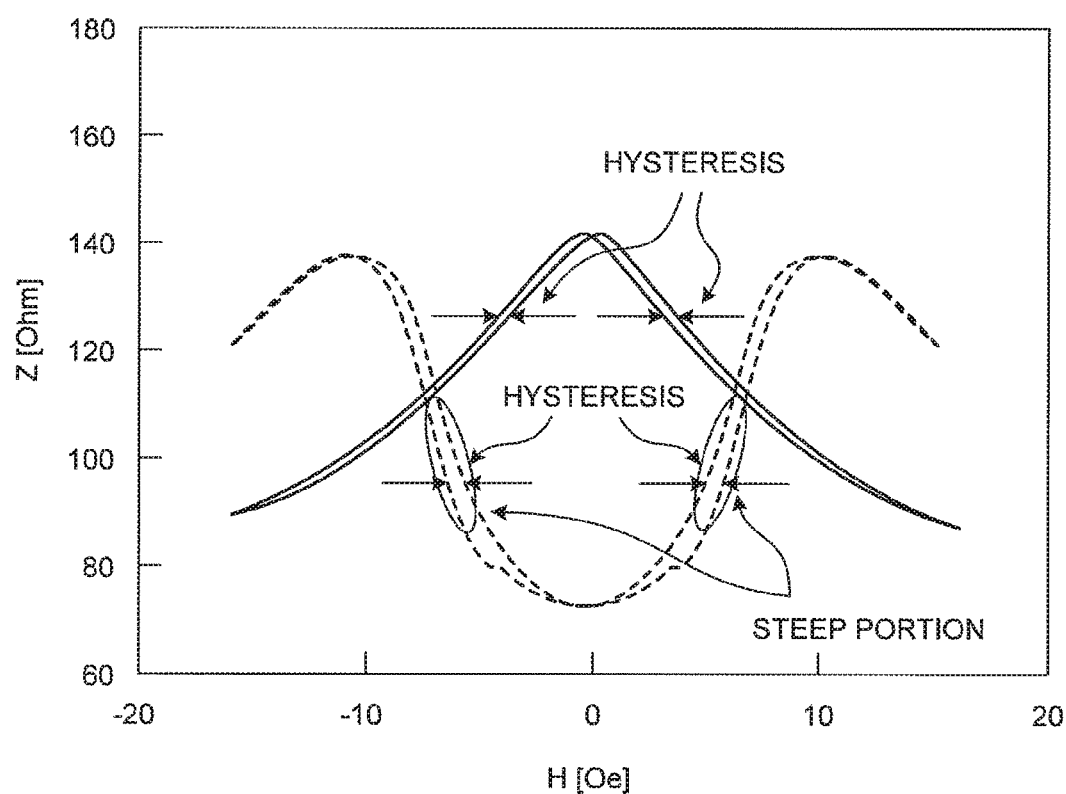
FIG. 3 is a diagram illustrating magneto-impedance characteristics.

FIG. 3 is a diagram illustrating magneto-impedance characteristics. In FIG. 3, the solid lines represent the characteristics according to the embodiment, and the dotted lines represent conventional characteristics. In FIG. 3, the horizontal axis represents a magnetic field H [Oe], and the vertical axis represents impedance Z [Ohm]. As indicated by the dotted lines in FIG. 3, the shape of the conventional magneto-impedance characteristics is an M-shape. In the M-shaped characteristics, the change in the impedance is extremely small with an external magnetic field near 0 [Oe]. Therefore, highly sensitive measurement has not been conventionally possible unless the AC bias at a level at which the inclination of the impedance change becomes steep is applied (4 [Oe] to 8 [Oe]). As a result, the current consumption is increased. An approach for applying a DC bias at a level at which the inclination of the impedance change becomes steep also requires an increased current consumption.

Furthermore, with the M-shaped characteristics, the hysteresis becomes increased where the impedance changes at a steep inclination, as illustrated in FIG. 3, and the detection precision deteriorates according to the amount of hysteresis. Moreover, the highly sensitive magnetic field measurement is only possible within the range where the impedance changes at a steep inclination. Therefore, only a limited detection range is available.

By contrast, in the embodiment, pyramid-shaped magneto-impedance characteristics are achieved by matching the magnetic field detecting direction and the axis of easy magnetization of the magnetic thin-film 12b. In the pyramid-shaped characteristics, as illustrated in FIG. 3, some amount of impedance change is ensured even near the external magnetic field of 0 [Oe]. In other words, the characteristics represent some inclination even near 0 [Oe]. Therefore, the application of a DC or AC bias at a level at which the inclination of the impedance change becomes steep, which is required with the M-shaped characteristics, is rendered unnecessary, and the power consumption can be reduced.

Furthermore, the pyramid-shaped characteristics generally exhibit a smaller hysteresis than that in a part of the M-shaped characteristics where the impedance change is steep. Therefore, with the pyramid-shaped characteristics, detection precision can be improved compared with that with the M-shaped characteristics. Furthermore, because the pyramid-shaped characteristics represent some degree of inclination across the entire range, a wider detection range can be ensured.

Figure 4A:
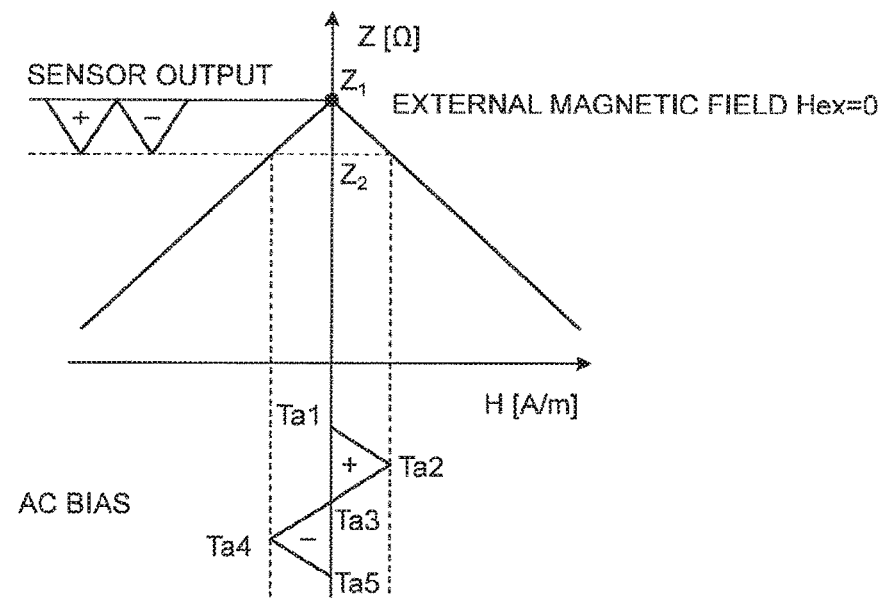
FIG. 4A is diagram illustrating an output from a sensor including the magneto-impedance element and a resistor according to the embodiment when an external magnetic field is 0 [H/m]
Figure 4B:
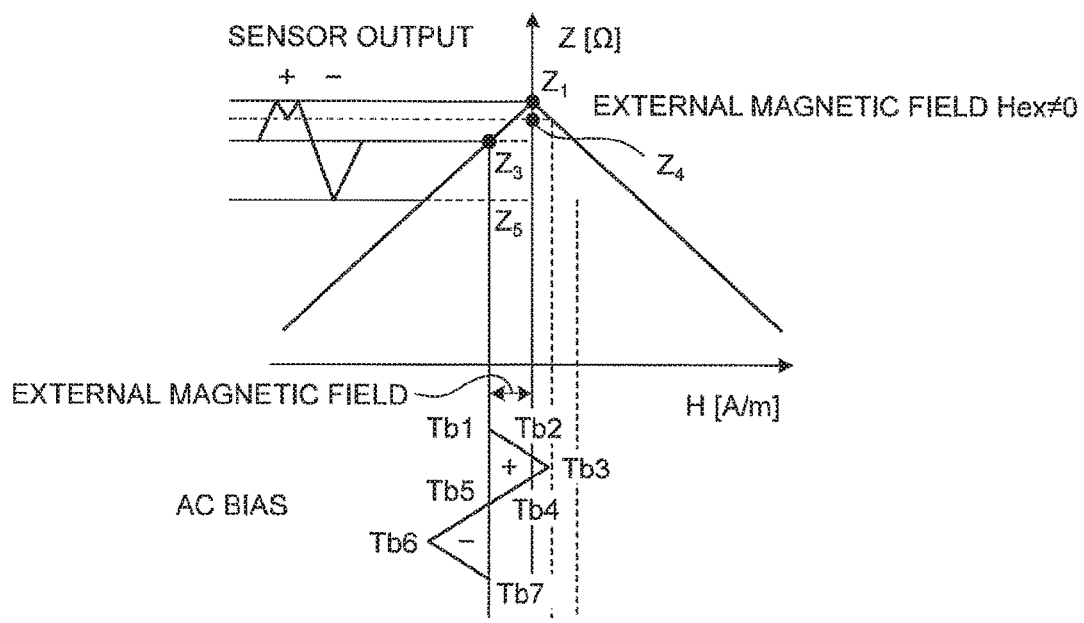
FIG. 4B is a diagram illustrating an output from the sensor including the magneto-impedance element and the resistor according to the embodiment when the external magnetic field is negative (e.g., −40 [H/m])

FIGS. 4A and 4B are diagrams illustrating outputs of a sensor including the magneto-impedance element 12 and the resistor R according to the embodiment. FIG. 4A illustrates an example in which the external magnetic field is 0 [H/m], and FIG. 4B illustrates an example in which the external magnetic field is negative (e.g., −40 [H/m]). In FIGS. 4A and 4B, the horizontal axis represents the strength H [A/m] of the magnetic field, and the vertical axis represents the impedance Z [Ω].

As illustrated in FIG. 4A, because the magnetic field detection sensor 1 according to the embodiment exhibits pyramid-shaped magneto-impedance characteristics, when the external magnetic field is 0 [H/m], the AC bias oscillates bisymmetrically with respect to the apex of the pyramid (bisymmetrically in FIG. 4), and a frequency of the impedance change output from the sensor corresponding to the AC bias becomes a double of the AC bias frequency.

To explain more specifically, the magnetic field detection sensor 1 exhibits impedance $Z_1$ with respect to the AC bias at time Ta1, and impedance $Z_2$ with respect to the AC bias at time Ta2. The magnetic field detection sensor 1 also exhibits the impedance $Z_1$ with respect to the AC bias at time Ta3, exhibits impedance $Z_2$ with respect to the AC bias at time Ta4, and exhibits the impedance $Z_1$ with respect to the AC bias at time Ta5. In this manner, the frequency of the sensor output will be a double of the AC bias frequency.

By contrast, when the external magnetic field is negative, the center of the AC bias oscillation will be offset from the apex of the pyramid, as illustrated in FIG. 4B, and the sensor output will change accordingly.

To explain more specifically, the magnetic field detection sensor 1 exhibits impedance $Z_3$ with respect to the AC bias at time Tb1, and exhibits the impedance $Z_1$ with respect to the AC bias at time Tb2. The magnetic field detection sensor 1 exhibits impedance $Z_4$ with respect to the AC bias at time Tb3, exhibits the impedance $Z_1$ with respect to the AC bias at time Tb4, and exhibits the impedance $Z_3$ with respect to the AC bias at time Tb5. The magnetic field detection sensor 1 exhibits impedance $Z_5$ with respect to the AC bias at time Tb6, and exhibits the impedance $Z_3$ with respect to the AC bias at time Tb7.

In this manner, when the external magnetic field is negative, the sensor output will have a different form, compared with when the external magnetic field is 0 [H/m], and the sensor output takes two maximum values and two minimum values. These maximum values and minimum values are used as the trigger waveform in the first differentiating circuit 20, the second amplifier 22, and the second differentiating circuit 24, as will be described later. Explained with reference to FIG. 4B is an example in which the external magnetic field is negative, but the same can be said when the external magnetic field is positive, except that the center of the AC bias will be offset in the opposite direction.

FIG. 5 is a timing chart illustrating various signals when the external magnetic field is 0 [H/m]. In the timing charts illustrated in FIG. 5, and FIGS. 6 and 7 explained later, the horizontal axis represents the temporal axis [t], and the vertical axis represents, sequentially from the top to the bottom, "the pulse voltage output from the micro-computer to the filter", "the AC bias applied to the negative-feedback bias coil", "the half-bridge circuit output", "the second differentiating circuit output", and "the output from the flip-flop circuit" [V]. In the explanation below, "the pulse voltage output from the micro-computer to the filter" is sometimes referred to as a first row, and "the AC bias applied to the negative-feedback bias coil" is sometimes referred to as a second row. "The half-bridge circuit output" is sometimes referred to as a third row, "the second differentiating circuit output" is sometimes referred to as a fourth row, and "the output from the flip-flop circuit" is sometimes referred to as a fifth row.

As indicated in the first row in FIG. 5, the micro-computer 30 outputs a signal at a predetermined frequency (AC bias frequency $f_0$). Specifically, the frequency signal rises at time $t_{10}$, falls at time $t_{20}$, rises at time $t_{30}$, falls at time $t_{40}$, and rises at time $t_{50}$. The signal having such a frequency is converted into a triangle wave by the filter 32, and amplified by the third amplifier 34, and the AC bias indicated in the second row in FIG. 5 is generated. This AC bias takes the maximum value at the time $t_{10}$, takes the minimum value at time $t_{20}$, takes the maximum value at the time $t_{30}$, takes the minimum value at time $t_{40}$, and takes the maximum value at the time $t_{50}$. Such an AC bias is applied to the negative-feedback bias coil 14, and an alternating current magnetic field is applied to the magneto-impedance element 12.

When the bias voltage described above is applied to the negative-feedback bias coil 14, assuming that the external magnetic field is 0 [H/m], the half-bridge circuit output will be at a double of the AC bias frequency, as explained with reference to FIG. 4A. Specifically, the half-bridge circuit output takes the minimum value at the time $t_{10}$, $t_{20}$, $t_{30}$, $t_{40}$, and $t_{50}$, as indicated in the third row in FIG. 5. The half-bridge circuit output takes the maximum value at time $t_{60}$ which is intermediate between the time $t_{10}$ and the time $t_{20}$, time $t_{70}$ which is intermediate between the time $t_{20}$ and the time $t_{30}$, time $t_{80}$ which is intermediate between the time $t_{30}$ and the time $t_{40}$, and time $t_{90}$ which is intermediate between the time $t_{40}$ and the time $t_{50}$.

The half-bridge circuit output is then turned into a trigger waveform via the first differentiating circuit 20, the second amplifier 22, and the second differentiating circuit 24. Specifically, the trigger waveform is output correspondingly to the maximum value and the minimum value of the half-bridge circuit output, as indicated in the fourth row in FIG. 5. In other words, the trigger waveform is acquired at the time $t_{10}$, $t_{20}$, $t_{30}$, $t_{40}$, $t_{50}$, $t_{60}$, $t_{70}$, $t_{80}$, and $t_{90}$. The trigger waveform takes a positive-side trigger waveform at the time $t_{10}$, $t_{20}$, $t_{30}$, $t_{40}$, and $t_{50}$, and takes a negative-side trigger waveform at time $t_{60}$, $t_{70}$, $t_{80}$, and $t_{90}$.

The flip-flop circuit 28 receiving such a trigger waveform keeps outputting a HIGH level signal during the time in which the trigger waveform is on the negative side. The duration of the trigger waveform being on the negative side, that is, the time T in which the HIGH level signal is output changes depending on the external magnetic field. The micro-computer 30, therefore, detects the external magnetic field based on the time T during which the signal is at the HIGH level. In the example illustrated in FIG. 5, the time $T=1/2f_0$, and therefore, the micro-computer 30 detects that the external magnetic field is 0 [H/m].

FIG. 6 is a timing chart illustrating the various signals when the external magnetic field is positive.

To begin with, as indicated in the first row in FIG. 6, the micro-computer 30 outputs a signal at a predetermined frequency (AC bias frequency $f_0$). This signal is the same as that illustrated in the first row in FIG. 5, and rises at time $t_{1+}$, falls at time $t_{2+}$, rises at time $t_{3+}$, falls at time $t_{4+}$, and rises at time $t_{5+}$. The signal having such a frequency is converted into a triangle wave by the filter 32, and amplified by the third amplifier 34, and the AC bias indicated in the second row in FIG. 6 is generated. This AC bias is the same as that illustrated in the second row in FIG. 5, and takes the maximum value at the time $t_{1+}$, takes the minimum value at the time $t_{2+}$, takes the maximum value at the time $t_{3+}$, takes the minimum value at the time $t_{4+}$, and takes the maximum value at the time $t_{5+}$. Such an AC bias is applied to the negative-feedback bias coil 14, and an alternating current magnetic field is applied to the magneto-impedance element 12.

When the bias voltage described above is applied to the negative-feedback bias coil 14, the half-bridge circuit output, assuming that the external magnetic field is positive, will be the same as that illustrated in FIG. 4B, but offset in the positive direction. Specifically, the half-bridge circuit output takes the minimum value at the time $t_{1+}$, $t_{2+}$, $t_{3+}$, $t_{4+}$, and $t_{5+}$, as indicated in the third row in FIG. 6. The half-bridge circuit output takes the maximum value at time $t_{6+}$ which is in between the time $t_{1+}$ and the time $t_{2+}$, time $t_{7+}$ which is in between the time $t_{2+}$ and the time $t_{3+}$, time $t_{8+}$ which is in between the time $t_{3+}$ and the time $t_{4+}$, and time $t_{9+}$ which is in between the time $t_{4+}$ and the time $t_{5+}$.

The time $t_{6+}$ and the time $t_{7+}$ corresponding to the maximum value are time near the time $t_{2+}$, and the time $t_{8+}$ and the time $t_{9+}$ are time near the time $t_{4+}$.

The half-bridge circuit output is then turned into a trigger waveform via the first differentiating circuit 20, the second amplifier 22, and the second differentiating circuit 24. Specifically, trigger waveform is output correspondingly to the maximum values and the minimum values of the half-bridge circuit output, as indicated in the fourth row in FIG. 6. In other words, the trigger waveform is acquired at the time $t_{1+}$, $t_{2+}$, $t_{3+}$, $t_{4+}$, $t_{5+}$, $t_{6+}$, $t_{7+}$, $t_{8+}$, and $t_{9+}$. The trigger waveform takes a positive-side trigger waveform at the time $t_{1+}$, $t_{2+}$, $t_{3+}$, $t_{4+}$, and $t_{5+}$, and takes a negative-side trigger waveform at the time $t_{6+}$, $t_{7+}$, $t_{8+}$, and $t_{9+}$.

The flip-flop circuit 28 receiving such a trigger waveform keeps outputting a HIGH level signal during the time in which the trigger waveform is on the negative side. Assuming that the external magnetic field is positive, the time $t_{6+}$ and the time $t_{7+}$ at which the negative-side trigger waveform is generated are both near the time $t_{2+}$, and the time $t_{9+}$ and the time $t_{9+}$ are near the time $t_{4+}$. Therefore, the time T during which the signal is at the HIGH level becomes longer than that in the example illustrated in FIG. 5. The micro-computer 30, therefore, detects the external magnetic field based on the time T during which the signal is at the HIGH level. In the example illustrated in FIG. 6, the time $T>1/2f_0$, and therefore, the micro-computer 30 detects that the external magnetic field is positive.

Figure 7:
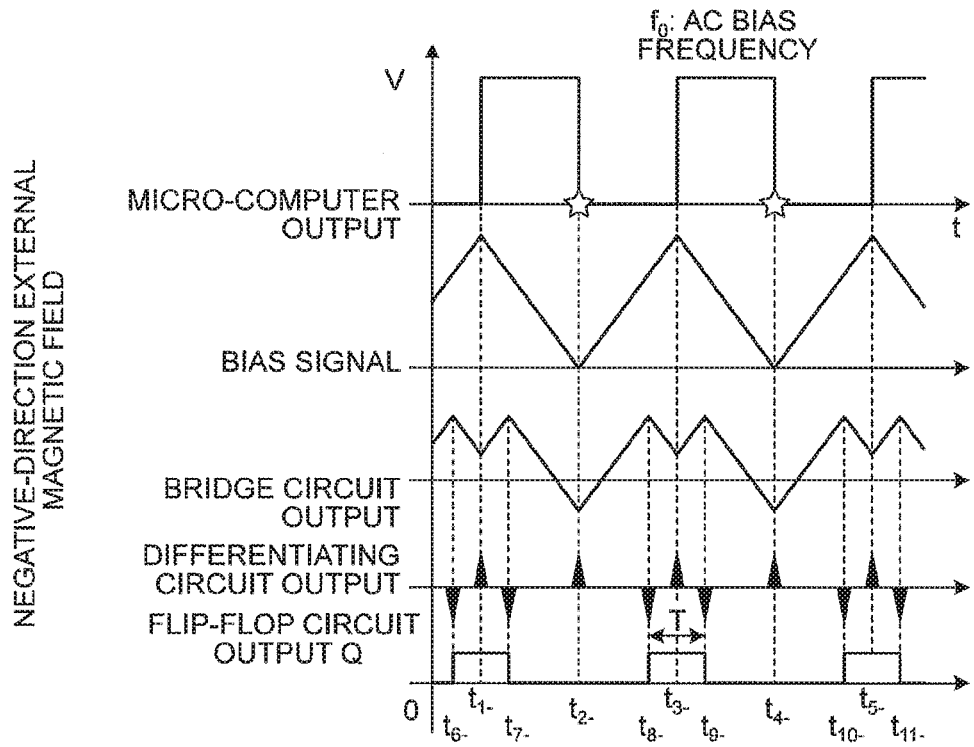
FIG. 7 is a timing chart illustrating various signals when the external magnetic field is negative.

FIG. 7 is a timing chart illustrating the various signals when the external magnetic field is negative.

To begin with, as indicated in the first row in FIG. 7, the micro-computer 30 outputs a signal at a predetermined frequency (AC bias frequency $f_0$). This signal is the same as that illustrated in the first row in FIG. 5, and rises at time $t_{1-}$, falls at time $t_{2-}$, rises at time $t_{3-}$, falls at time $t_{4-}$, and rises at time $t_{5-}$. The signal having such a frequency is converted into a triangle wave by the filter 32, and amplified by the third amplifier 34, and the AC bias indicated in the second row in FIG. 7 is generated. This AC bias is the same as that illustrated in the second row in FIG. 5, and takes the maximum value at the time $t_{1-}$, takes the minimum value at the time $t_{2-}$, takes the maximum value at the time $t_{3-}$, takes the minimum value at the time $t_{4-}$, and takes the maximum value at the time $t_{5-}$. Such an AC bias is applied to the negative-feedback bias coil 14, and an alternating current magnetic field is applied to the magneto-impedance element 12.

When the bias voltage described above is applied to the negative-feedback bias coil 14, assuming that the external magnetic field is negative, the half-bridge circuit output will be the same as that explained with reference to FIG. 4B. Specifically, half-bridge circuit output takes the minimum value at the time $t_{1-}$, $t_{2-}$, $t_{3-}$, $t_{4-}$, and $t_{5-}$, as indicated in the third row in FIG. 7. The half-bridge circuit output takes the maximum value at time $t_{6-}$ which is in between the time 0 and the time $t_{1-}$, time $t_{7-}$ which is in between the time $t_{1-}$ and the time $t_{2-}$, time $t_{8-}$ which is in between the time $t_{2-}$ and the time $t_{3-}$, time $t_{9-}$ which is in between the time $t_{3-}$ and the time $t_{4-}$, time $t_{10-}$ which is in between the time $t_{4-}$ and the time $t_{5-}$, and time $t_{11-}$ subsequent to the time $t_{5-}$.

The time $t_{6-}$ and the time $t_{7-}$ corresponding to the maximum value are time near the time $t_{1-}$, and the time $t_{8-}$ and time $t_{9-}$ are also near the time $t_{3-}$. The time $t_{10-}$ and the time $t_{11-}$ are also time near the time $t_{5-}$.

The half-bridge circuit output is then turned into a trigger waveform via the first differentiating circuit 20, the second amplifier 22, and the second differentiating circuit 24. Specifically, the trigger waveform is output correspondingly to the maximum values and the minimum values of the half-bridge circuit output, as indicated in the fourth row in FIG. 7. In other words, the trigger waveform is acquired at the time $t_{1-}$, $t_{2-}$, $t_{3-}$, $t_{4-}$, $t_{5-}$, $t_{6-}$, $t_{7-}$, $t_{8-}$, $t_{9-}$, $t_{10-}$, and $t_{11-}$. The trigger waveform takes a positive-side trigger waveform at the time $t_{1-}$, $t_{2-}$, $t_{3-}$, $t_{4-}$, and $t_{5-}$, and takes a negative-side trigger waveform at the time $t_{6-}$, $t_{7-}$, $t_{8-}$, $t_{9-}$, $t_{10-}$, and $t_{11-}$.

The flip-flop circuit 28 receiving such a trigger waveform keeps outputting a HIGH level signal during the time in which the trigger waveform is on the negative side. When the external magnetic field is negative, the time $t_{6-}$ and time $t_{7-}$ at which the negative-side trigger waveform is generated are both near the time $t_{1-}$, and the time $t_{8-}$ and the time $t_{9-}$ are also near the time $t_{3-}$. The time $t_{10-}$ and the time $t_{11-}$ are also time near the time $t_{5-}$. The time T during which the signal is at the HIGH level, therefore, becomes shorter than that in the example illustrated in FIG. 5. The micro-computer 30, therefore, detects the external magnetic field based on the time T during which the signal is at the HIGH level. In the example illustrated in FIG. 5, the time $T<1/2f_0$, and therefore, the micro-computer 30 detects that the external magnetic field is negative.

In the example described above, it is preferable for the micro-computer 30 to transmit a RESET signal to the flip-flop circuit 28 at the fall of the AC bias frequency $f_0$ (at the timing indicated by a star mark in FIGS. 5 to 7), and for the micro-computer 30 to detect the external magnetic field based on the time T corresponding to the first HIGH level signal subsequent to the RESET signal. In this manner, it is possible to respond to the situation in which the second differentiating circuit 24 fails to output a trigger waveform accurately.

Figure 8:
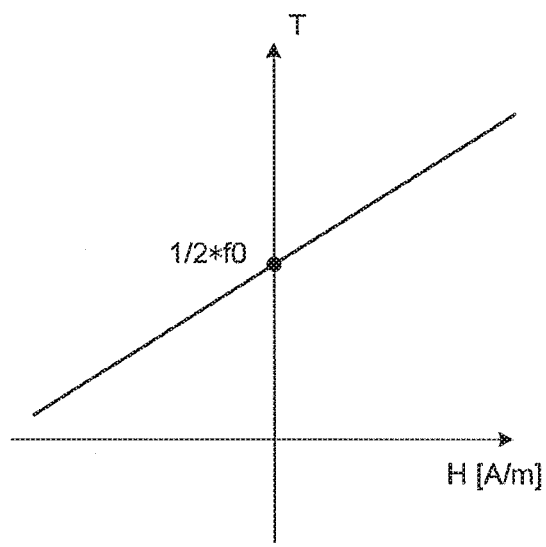
FIG. 8 is a diagram illustrating a correlation between time during which a signal is at a HIGH level and the strength of the external magnetic field.

FIG. 8 is a diagram illustrating a correlation between the time T during which the signal is at HIGH level, and the strength of the external magnetic field. In this embodiment, the micro-computer 30 can detect not only the direction (positive, negative) but also the strength of the external magnetic field by storing the data illustrated in FIG. 8 in advance.

As described above, in the magnetic field detection sensor 1 according to the embodiment, the longitudinal direction of the magneto-impedance element 12 matches the magnetic field detecting direction, and the magneto-impedance element 12 is configured to have a magnetic anisotropy such that an axis of easy magnetization of the magnetic thin-film 12b matches the longitudinal direction. By matching the direction of the magnetic field detecting direction and the axis of easy magnetization of the magnetic thin-film 12b in the magnetic field detection sensor 1, pyramid-shaped magneto-impedance characteristics can be achieved. By achieving pyramid-shaped magneto-impedance characteristics in the magnetic field detection sensor 1, the application of a DC or AC bias at a level at which the inclination of the impedance change becomes steep, which has been required in a sensor with M-shaped characteristics, is rendered unnecessary. Moreover, because the magnetic field detection sensor 1 with the pyramid-shaped characteristics exhibits a smaller hysteresis than that with the M-shaped characteristics, detection precision can be improved. Furthermore, because the pyramid-shaped characteristics have some degree of inclination across the entire range, a wider detection range can be ensured. Therefore, the magnetic field detection sensor 1 can reduce the current consumption, improve the detection precision, and achieve a wider detection range.

Furthermore, because the magnetic field detection sensor 1 detects the external magnetic field based on the trigger waveform output from the second differentiating circuit 24, a sensor more robust against noise can be provided compared with a configuration in which the external magnetic field is detected based on the difference in amplitude, and a configuration in which an integration circuit is used. The magnetic field detection sensor 1 can therefore further improve the detection precision.

Furthermore, the magnetic field detection sensor 1 can suppress an increase in size and costs, compared with a configuration including a negative-feedback coil and a bias coil separately.

The present invention is explained above based on an exemplary embodiment, but the present invention is not limited thereto, and modifications are still possible within the scope not deviating from the spirit of the present invention.

For example, the magnetic field detection sensor 1 according to the embodiment is provided with one negative-feedback bias coil 14, but a negative-feedback coil and a bias coil may be provided separately, without limitation to the integrated negative-feedback bias coil 14.

Furthermore, in the embodiment, the magnetic thin-film 12b of the magneto-impedance element 12 has a meandering shape (serpentine shape) in the plan view, but may have a linear shape, for example, without limitation to the meandering shape.

Furthermore, in the embodiment, the micro-computer 30 detects the external magnetic field based on the time in which the HIGH level signal is output, but without limitation to this, may detect the external magnetic field based on the time starting from the AC bias frequency $f_0$ to the timing of the fall of the HIGH level signal, for example, because the same effects can be achieved thereby.

In the magnetic field detection sensor, the magnetic field detecting direction matches the longitudinal direction of the magneto-impedance element in the magnetic field detection sensor, and the magnetic film is provided with a magnetic anisotropy such that a direction of an axis of easy magnetization extends along the longitudinal direction. In the magnetic field detection sensor, by matching the magnetic field detecting direction with the axis of easy magnetization of the magnetic film, pyramid-shaped magneto-impedance characteristics can be achieved. With the pyramid-shaped magneto-impedance characteristics of the magnetic field detection sensor, an application of a DC or AC bias at a level at which the inclination of the impedance change becomes steep in the M-shaped characteristics, is rendered unnecessary. In addition, because a magnetic field detection sensor with the pyramid-shaped characteristics exhibits a smaller hysteresis compared with that with the M-shaped characteristics, detection precision can be improved. Furthermore, because the pyramid-shaped characteristics represent some degree of inclination across the entire range, a wider detection range can be ensured. The magnetic field detection sensor can therefore reduce current consumption, improve detection precision, and ensure a wider detection range.

With the magnetic field detection sensor, because the magnetic field detection sensor detects the external magnetic field based on the trigger waveform output from the differentiating circuit, a sensor more robust against noise can be provided, compared with a configuration in which the external magnetic field is detected based on the height difference in the amplitude, and a configuration in which an integration circuit is used. The magnetic field detection sensor can therefore further improve the detection precision.

With the magnetic field detection sensor, the magnetic field detection sensor can suppress an increase in size and costs, compared with a configuration in which a negative-feedback coil and a bias coil are provided separately.

According to the present invention, it is possible to provide a magnetic field detection sensor capable of reducing current consumption, improving the detection precision, and ensuring a wider detection range.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A magnetic field detection sensor comprising:
a magneto-impedance element configured to make use of a magneto-impedance effect;
a bias coil configured to apply a bias magnetic field to the magneto-impedance element;
an oscillator circuit configured to apply an alternating-current to the magneto-impedance element;
a differentiating circuit configured to differentiate an output of the magneto-impedance element;
a flip-flop circuit configured to output a high level signal and a low level signal based on a trigger waveform output from the differentiating circuit; and
a computing unit configured to detect an external magnetic field based on a high and low timing of the high level and low level signal output from the flip-flop circuit, wherein the magnetic field detection sensor is configured to detect the external magnetic field based on an output obtained by applying the alternating-current to the magneto-impedance element, the magneto-impedance element includes a non-magnetic substrate and a magnetic film provided on a surface of the non-magnetic substrate, a magnetic field detecting direction matches a longitudinal direction of the magneto-impedance element, and the magnetic film is configured to have a magnetic anisotropy such that an axis of easy magnetization thereof matches the magnetic field detecting direction, and the computing unit is configured to transmit a reset signal to the flip flop circuit at timing of a fall of an alternating-current bias frequency, and detect the external magnetic field based on a duration of a first negative-side of the trigger waveform subsequent to the reset signal.

2. The magnetic field detection sensor according to claim 1, wherein the bias coil is composed of a single negative-feedback bias coil configured to apply the bias magnetic field and a negative-feedback magnetic field to the magneto-impedance element.

* * * * *